United States Patent

Marzolf

[15] 3,694,670

[45] Sept. 26, 1972

[54] EASILY SWITCHED SILICON CONTROLLED RECTIFIER

[72] Inventor: Joseph M. Marzolf, 3304 Garland Drive, Falls Church, Va. 22041

[22] Filed: Oct. 26, 1971

[21] Appl. No.: 192,099

[52] U.S. Cl. ...........307/252 M, 307/252 J, 307/315, 307/303, 317/235

[58] Field of Search .......317/235, 231; 307/252, 315

[56] References Cited

UNITED STATES PATENTS

| | | | |
|---|---|---|---|
| 2,663,806 | 12/1953 | Darlington | 307/315 |
| 3,197,710 | 7/1965 | Lin | 307/315 X |
| 3,210,556 | 10/1965 | Billings | 307/87 |
| 3,331,992 | 7/1967 | Walker | 307/252 X |
| 3,439,189 | 4/1969 | Petry | 307/252 |
| 3,489,923 | 1/1970 | Dahele | 307/241 |
| 3,590,339 | 6/1971 | Belo et al. | 307/235 |

*Primary Examiner*—James D. Kallam
*Attorney*—R. S. Sciascia et al.

[57] ABSTRACT

A combination of transistors, which can be integrally formed with an SCR is used to effect a turn-off. The magnitude of the turn-off pulse is less than that required to turn it on. When the entire circuit is self contained, only four leads to the device are required. Two of the leads handle the load current in the typical well known manner. The SCR turn-on is effected by a pulse applied to the gate through a third lead. A fourth lead is provided to turn the SCR off by causing an anode to cathode short across the SCR. This short is controlled by two transistors connected in an "inverted darlington" configuration.

5 Claims, 3 Drawing Figures

PATENTED SEP 26 1972 3,694,670

INVENTOR
JOSEPH M. MARZOLF

EASILY SWITCHED SILICON CONTROLLED RECTIFIER

BACKGROUND OF THE INVENTION

This invention relates to a semiconductor switching device and more particularly to a circuit for controlling the turn-off capability of a silicon controlled rectifier. The silicon controlled rectifier, commonly called the SCR, includes four layers of adjacent regions of an alternate P and N conductivity to form three adjacent PN junctions. Usually the SCR is employed as a switch wherein a current flow takes place between the anode and the cathode or intrinsically through all four adjacent regions and the three PN junctions.

As is well known in the art, the middle PN junction must be forward biased before the SCR will conduct current between the anode and the cathode. Usually this is accomplished by applying a pulse of a polarity consonant with an electrode connection to the intermediate P region. This controlling electrode is usually called the gate. Thus, for example, a positive pulse applied between a positive (P) gate with respect to the cathode, will forward bias the SCR, and permit current flow from the anode to the cathode.

Turning the SCR on requires a relatively small current typically in the order of milliamps. However, turning the SCR off once it has been turned on presents a far greater problem and as a result many types of turn-off circuitry have been developed to overcome this difficulty.

In the most sophisticated circuits, transistors, capacitors, and coils are elaborately connected to effect a proper turn off. The only way of turning off a conducting SCR is to reduce its current instantaneously to a valve less than the holding current (a few ma.) for sufficient time for the SCR to regain its blocking capability. This is usually done by (a) mechanically opening the circuit, (b) instantaneously reverse biasing the SCR or (c) diverting the load current through a low impedance parallel path. As described in General Electric SCR Handbook (Page 72, 2d Ed.) a single transistor connected from an anode to the cathode has been employed to effect SCR turn-off. In this case a pulse is applied to the base of the transistor to turn the transistor on for a length of time equal to the required SCR recovery time. It has been found that this method, although limited by the current capability of the transistor, is effective to turn off the SCR but requires much more current applied to the base of the transistor to do so than it does to turn the SCR on by way of the gate. As a result of this inherent difficulty of manipulating the turn-off capability of this type of circuit, I have devised a circuit which not only requires less applied current to effect a turn-off than the current required to effect a turn-on but the voltages are of the same polarity.

SUMMARY

An SCR, connected in series with a load, is controlled by the gate of the SCR and a transistor arrangement connected in parallel with the SCR. A pulse applied to the gate turns the SCR on in the typical well known manner. A first transistor is connected across the anode and the cathode of the SCR and is responsible for diverting the load current through the SCR for a length of time to permit the SCR to turn off. This transistor is controlled by a second transistor of a polarity opposite the first. Thus, the base of the first transistor is controlled by the switching action of the emitter to collector junction of the second transistor. Hence, when a pulse is applied to the base of the second transistor it turns on. When the second transistor is on, the emitter to base junction of the first transistor is controlled to permit the load current to be diverted therethrough for a length of time to permit the SCR to recover and turn off.

OBJECTS

An object of this invention is to provide an SCR circuit which is capable of being turned on and off with a pulse of the same polarity, wherein the amplitude of the turn-off pulse is less than the amplitude of the turn-on pulse.

Another object of the present invention is to provide an SCR circuit which is self-contained and does not require additional gate control over power supplies and components.

Other objects and advantages will become readily apparent to those skilled in the art after an understanding of this specification and the drawings, wherein similar parts are denoted the same throughout.

DRAWINGS

DETAILED DESCRIPTION

Figure 1:
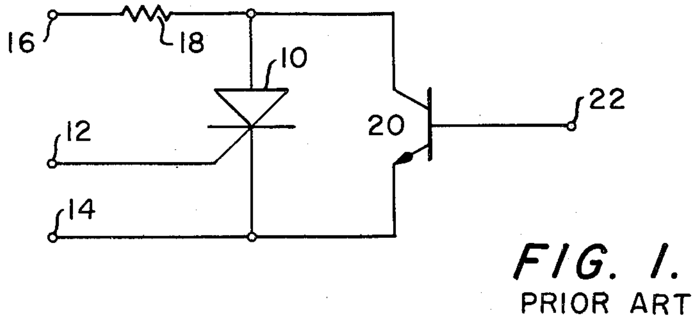
FIG. 1. PRIOR ART
FIG. 1 is a diagram of a transistor connected to an SCR in the well known manner of the prior art.

Referring to FIG. 1, which is a showing of the prior art, SCR 10 is connected in series with load 18 through its anode and cathode. A voltage source is usually connected to terminals 14 and 16, the size of which depends on the required current flow through load 18. The collector of NPN transistor 20 is connected to the SCR's anode.

When a pulse is applied to gate 12, the SCR permits a current flow through load 18. The SCR remains conducting until a short can be provided across its anode and cathode. If the short is of a sufficient length of time, the SCR will recover and current flow through load 18 will cease. To effect this turn-off, a positive pulse of high magnitude must be applied between base 22 of the transistor 20 and the cathode of the SCR. This pulse effects a turn-on of transistor 20 to provide the required short between the anode and the cathode of SCR 10. Due to the high turn-off current requirement, the pulse applied to transistor 20 is of unmanageable proportions. Also, power transistor 20 must be capable of carrying the full current through load 18, during the shorting time, and will do so if the saturation voltage of the transistor is considerably less than that of the SCR 10. Of the many inherent drawbacks of this system, the most pronounced is the fact that an application of a pulse of an undesirably large magnitude is required to manipulated the transistor, which in turn controls SCR turn-off.

Figure 2:
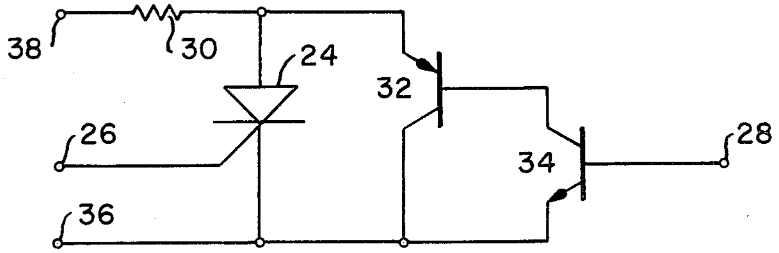
FIG. 2 is a circuit diagram of the novel SCR-transistor circuitry of this invention.

As can be seen in FIG. 2, a new approach to SCR turn-off control, as encompassed by this invention, can be obtained by employing two transistors of opposite polarity. For purposes of explanation, the dual transistor arrangement 32 and 34 are connected in what might be called an "inverted darlington" circuit wherein the emitter of PNP transistor 32 is connected to the anode of SCR 24. Connected to the cathode of SCR 24 is the collector of transistor 32 and the emitter of NPN transistor 34. A control loop is formed by the connection of the collector of transistor 34 to the base of transistor 32.

When a voltage source is applied between terminals 36 and 38, the current flow through load 30 will be controlled by SCR 24. That is to say when a pulse is applied to gate 26, the SCR will permit the required current flow in the typical well-known manner. However, to turn the SCR off a pulse of similar amplitude and polarity is applied to the transistor control circuitry through base 28 of transistor 34 to forward bias the emitter to base junction. This forces the base of transistor 32 to approximately the voltage potential of the SCR cathode and hence transistor 32 is turned on. Thus, PNP transistor 32 is allowed to instantaneously carry the full load current during the recovery of SCR 24. The power required to operate the SCR in either turn-on or turn-off direction is very small. This may be attributed to the high gain resulting from the transistor arrangement but is enhanced by the proper selection of the elements. Thus, an optimum condition results when both SCR and transistor 32 have the same voltage blocking capabilities. Also, PNP transistor 32 must have a low saturation resistance.

Most importantly however, transistor 32 and 34 must be selected to provide a low leakage current when the SCR is in "OFF" condition.

When comparing this control circuitry, as shown in FIG. 2 to the circuit set forth as prior art in FIG. 1, it should be noted that one cannot merely "add on" another transistor to take advantage of a multiplied gain. When the comparison is made, it can easily be seen that although transistors 20 and 32 are both power transistors and must each be capable of handling their respective load currents during shorting time, they operate in an entirely different manner. First it should be noted that transistors 20 and 32 are of opposite polarity. That is, transistor 20 is an NPN transistor with its emitter connected to the cathode of SCR 10. Transistor 32, however is a PNP transistor with its emitter connected to the anode of SCR 24. This difference becomes important when selecting the control transistor 34. As shown in FIG. 2, the control loop affects the collector-to-base junction of the transistor 32 by making reference to the independent voltage drop between the emitter and the collector.

To effect this control, transistor 34 of a polarity opposite transistor 32 must be selected to control the base to collector junction of transistor 32. Thus when a positive pulse is applied to terminal 28 with respect to terminal 36, the base-to-emitter junction is forward biased thus turning transistor 34 on. With transistor 34 on, the potential of the base of 32 is effectively brought down to the cathode voltage to force transistor 32 on.

Figure 3:
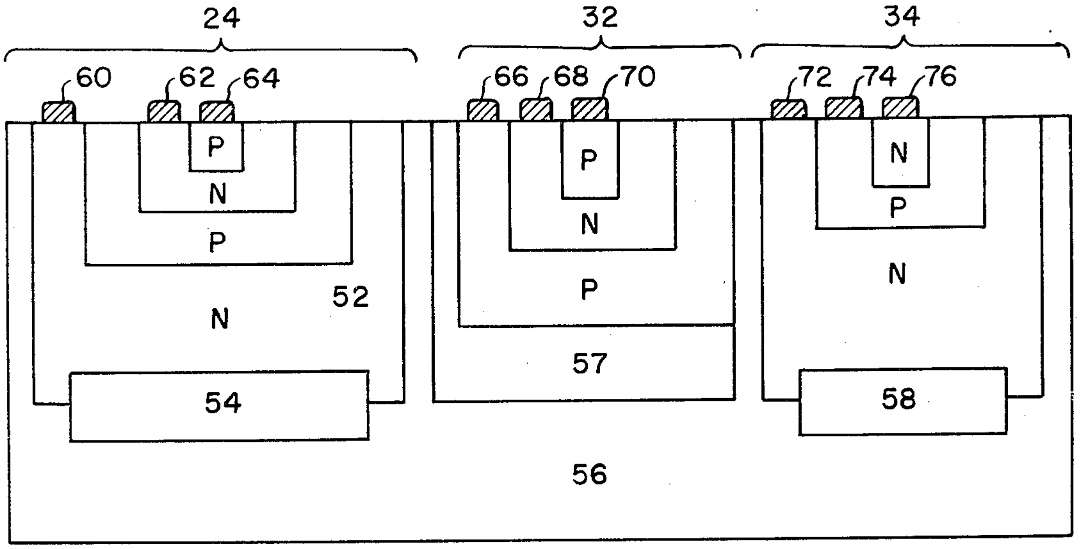
FIG. 3 is a schematic view of the intrinsic layers of the circuit elements shown in FIG. 2.

Referring to FIG. 3, it has been found that the SCR, controlled by the "inverted darlington" arrangement can be contained on a common P substrate 56. The chip, shown in cross-section includes SCR 24, and transistors 32 and 34. Each of the semiconductors are provided with connecting terminals such as pads 60, 62 and 64.

In this schematic view, it should be noted that PNP transistor 32 may be proportionally thicker P and N substrate layers when compared to similar layers on transistor 34. Also, the structure as shown in FIG. 3 facilitates construction of the device since corresponding elements may be manufactured by any typical process capable of depositing N+ buried layers 54 and 58 as well as the N epitaxial layers 52, 57 and 44. Although I prefer to lay contoured metal strips on the surface of the chip to affect circuit connection, wires can be connected from pad 64 to 70, 68 to 60. Thus, a self contained, easily controlled, SCR can be permanently encased in a suitable package. Terminals on the package must be provided of course for the SCR anode and cathode connection 60 and 64 as well as the gate 62 and a terminal leading to pad 74 to effect a turn-off.

Although this invention has been described with respect to its preferred embodiment, it should be understood that variations and modifications will now be obvious to those skilled in the art, and it is preferred therefore that the scope of the invention not be limited by the specific disclosure herein but only by the appended claims.

What is claimed and desired to be secured by Letters Patent of the United States is:

1. A silicon controlled rectifier circuit for aiding turn-off comprising:

a silicon controlled rectifier having an anode, a cathode, and a gate for turning the rectifier on upon application of an electrical pulse thereto;

means connected between said anode and said cathode for turning the silicon controlled rectifier off, said means for turning said rectifier off being operative upon application of an electrical pulse having a polarity identical to the pulse applied on said gate to turning said rectifier on and of less voltage magnitude than the voltage magnitude required in the pulse applied on said gate for turning said rectifier on.

2. The silicon controlled rectifier circuit as claimed in claim 1 wherein said silicon controlled rectifier and said means for turning said silicon controlled rectifier off are deposited on a common substrate.

3. A silicon controlled rectifier having an anode, a cathode, and a gate for turning the rectifier on upon application of an electrical pulse thereto; said anode and said cathode being coupled in series with a load and a voltage source, the improvement comprising:

a PNP transistor having an emitter, a base, and a collector, said emitter connected to said anode, said collector connected to said cathode; and a NPN transistor having a base, a collector, and an emitter, the collector of said NPN transistor connected to the base of said PNP transistor, the emitter of said NPN transistor connected to said cathode, said gate of the silicon controlled rectifier and said base of said NPN transistor being connectable to means for applying a pulse thereto, respectively for turning the silicon controlled rectifier on and off.

4. The device as claimed in claim 3 wherein said silicon controlled rectifier and said NPN and PNP transistors are discrete components.

5. The device as claimed in claim 3 wherein said silicon controlled rectifier and said PNP and NPN transistors are deposited on a common substrate.

* * * * *